(12) United States Patent
Dahroug

(10) Patent No.: US 6,973,391 B2
(45) Date of Patent: Dec. 6, 2005

(54) METHOD FOR PREDICTING WHETHER A FAILURE OF AN ELECTRICAL DEVICE MAY OCCUR

(75) Inventor: Omar G. Dahroug, Sunnyvale, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 500 days.

(21) Appl. No.: 10/308,471

(22) Filed: Dec. 3, 2002

(65) Prior Publication Data

US 2004/0107392 A1 Jun. 3, 2004

(51) Int. Cl.$^7$ ................................................. G06F 3/00
(52) U.S. Cl. ........................... 702/58; 702/57; 702/59; 702/190
(58) Field of Search .......................... 702/57–59, 75, 702/78, 90, 173, 190; 323/267; 326/86; 327/308; 714/814, 817

(56) References Cited

U.S. PATENT DOCUMENTS

| | | | |
|---|---|---|---|
| 5,535,133 A | 7/1996 | Petschauer et al. | ......... 364/489 |
| 6,026,286 A * | 2/2000 | Long | ............... 455/327 |
| 6,278,951 B1 * | 8/2001 | Sato | ............... 702/57 |
| 6,388,487 B1 * | 5/2002 | Hirose | ............... 327/205 |
| 6,820,234 B2 * | 11/2004 | Deas et al. | ............... 714/814 |
| 6,897,683 B2 * | 5/2005 | Kernahan et al. | ............. 326/86 |

* cited by examiner

Primary Examiner—Marc S. Hoff
Assistant Examiner—Felix Suarez
(74) Attorney, Agent, or Firm—Park, Vaughan & Fleming LLP (57) ABSTRACT

A method of predicting whether a failure of an electrical device may occur if a receiver within the electrical device is subjected to an electrical noise pulse. The method may include locating an integrated circuit that drives the receiver and locating an integrated circuit that is driven by the receiver, the integrated circuit that is driven by the receiver having a circuit type and a capacitance. The method may also include selecting a plurality of noise-tolerance curves and then selecting one of the plurality of noise-tolerance curves. The method may also include selecting a set of noise-propagation constants and then selecting a noise-propagation constant from the set of noise-propagation constants. The method may further include generating an offset noise-tolerance curve by offsetting the selected one of the plurality of noise-tolerance curves by the noise-propagation constant, determining a noise-tolerance for the receiver; and then comparing the noise-tolerance to the amplitude of the noise pulse.

21 Claims, 5 Drawing Sheets

METHOD FOR PREDICTING WHETHER A FAILURE OF AN ELECTRICAL DEVICE MAY OCCUR

1. FIELD OF THE INVENTION

The present invention generally relates to noise margin analysis of semiconductor devices. More specifically, the present invention relates methods of determining if an electronic noise event could create a failure in a semiconductor device.

2. BACKGROUND

Modern electrical devices, such as microprocessors and chipsets, include a very large number of integrated circuits, such as AND gates, OR gates, and NAND gates. Ideally, the digital signals that are generated by one integrated circuit will not affect the digital signal generated by any other integrated circuit unless the gates are electrically connected by metal traces or doped polysilicon. However, as more integrated circuits are placed closer together, an electrical transition on one trace ("the aggressor trace") can capacitively couple on to a different trace ("the victim trace"). As a result, a voltage pulse can appear on the victim trace. In addition, inductive coupling from the aggressor trace, and charge sharing or leakage current in the victim receiver, can degrade the victim signal.

If the voltage pulse is a small percentage of the voltage swing Vs from a "0" to a "1" logic level, then the voltage pulse is guaranteed not to cause the electrical device to malfunction. However, if a noise pulse seen by a receiver causes the output of that integrated circuit to deviate significantly from its quiescent value, then the resulting propagated noise pulse can interfere with other integrated circuits, and affect the correct operation of the system. To avoid the above problem, it is desirable to predict, before an electrical device is manufactured, whether misinterpretations of logic states may occur as a result of voltages pulses, i.e., electrical noise.

One method of predicting whether a misinterpretation may occur is to estimate the amplitude of the voltage pulse, which is often called the noise pulse, occurring at a receiver. If the amplitude of the noise pulse is greater than an allowable noise pulse for a given type of receiver ("the receiver's noise threshold"), such as 10% of the voltage swing Vs, then the receiver could make a logic state misinterpretation or could propagate noise that could affect the behavior of downstream circuits. Other methods of predicting whether a misinterpretation may occur compare the amplitude of the noise pulse with a lowered noise threshold to account for other noise sources, such as ground bounce.

While the above methods are relatively easy to implement, the methods are overly conservative for many electrical devices. In particular, the above methods are overly conservative for modern semiconductor devices with submicron integrated circuits.

Other methods of predicting whether a misinterpretation may occur compare the amplitude of the noise pulse with a more accurate noise threshold of a receiver. These methods classify receivers based upon one or more categories and, based upon the classification(s), determine a more accurate noise threshold. For example, receivers could be classified based upon one or more of the following: the type of integrated circuit that drives the receiver, the receiver's circuit type, and/or the type of circuit that is driven by the receiver, i.e., the "load" of the receiver. Based upon the above-described characterizations, more accurate noise thresholds can be compared against the amplitude of the noise pulse to determine whether a misinterpretation may occur. As a result, methods that characterize receivers and utilize more accurate noise thresholds can be less conservative than methods that do not utilize such characterizations.

Other methods of predicting whether a misinterpretation may occur utilize the energy of the noise pulse as well as the amplitude of the noise pulse. For example, the noise sensitivity of an integrated circuit can be characterized as a function of the amplitude of the noise pulse and the width of the noise pulse. As a result, a relatively accurate noise threshold can be determined for the integrated circuit. After performing the above characterization, the prediction of whether a logic state misinterpretation may occur can utilize the energy of the noise pulse and not just the amplitude of the noise pulse.

Still other methods of predicting a misinterpretation of a logic state characterize the noise sensitivity of the integrated circuit as a function of the load of the receiver.

While the above-described methods do provide relatively accurate indications of whether misinterpretations of logic states may occur as a result of electrical noise, still more accurate methods are needed.

3. SUMMARY OF INVENTION

One embodiment of the invention is a method of predicting whether a failure of an electrical device may occur if a receiver within the electrical device is subjected to an electrical noise pulse. The method may include locating an integrated circuit that drives the receiver and locating an integrated circuit that is driven by the receiver, the integrated circuit that is driven by the receiver having a circuit type and a capacitance. The method may also include selecting a plurality of noise-tolerance curves and then selecting one of the plurality of noise-tolerance curves. The method may also include selecting a set of noise-propagation constants and then selecting a noise-propagation constant from the set of noise-propagation constants. The method may further include generating an offset noise-tolerance curve by offsetting the selected one of the plurality of noise-tolerance curves by the noise-propagation constant, determining a noise-tolerance for the receiver; and then comparing the noise-tolerance to the amplitude of the noise pulse.

Other embodiments of the invention include program storage devices storing computer readable instructions that when executed by a computer, perform variations of the above method. Still other embodiments of the invention include electrical devices that are manufactured using variations of the above method.

5. DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

One embodiment of the invention is a method of predicting whether a failure of an electrical device may occur when the electrical device is subjected to a noise pulse. A flowchart depicting such method is shown in FIG. 1.

5.1 Locating a Driver

Figure 1:
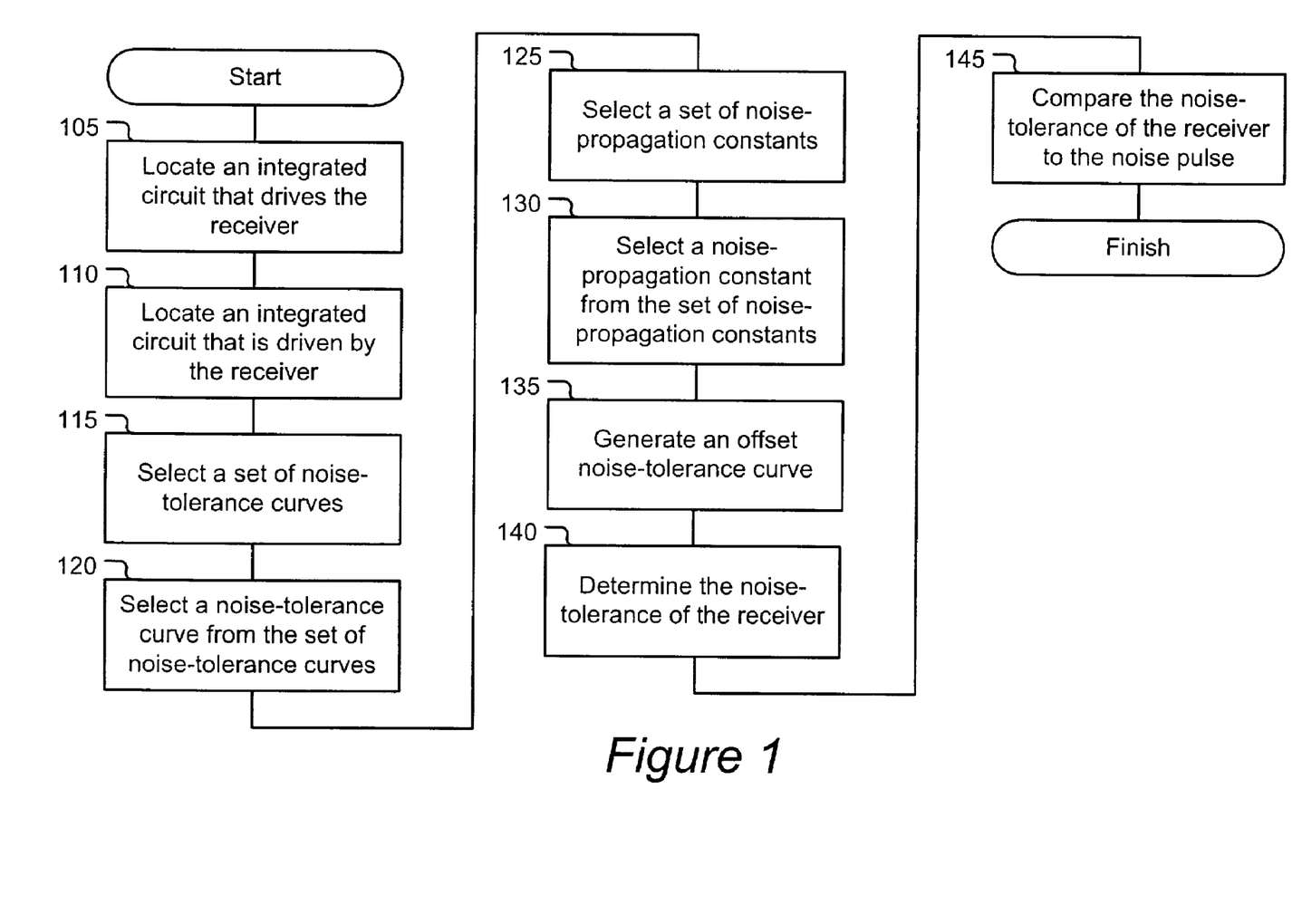
FIG. 1 presents a flow chart of one embodiment of the invention.

As shown in Block 105 of FIG. 1, one step in the method is locating an integrated circuit that drives the receiver. For example, the method could be utilized to locate an integrated circuit that drives an integrated circuit within FIG. 2.

Figure 2:
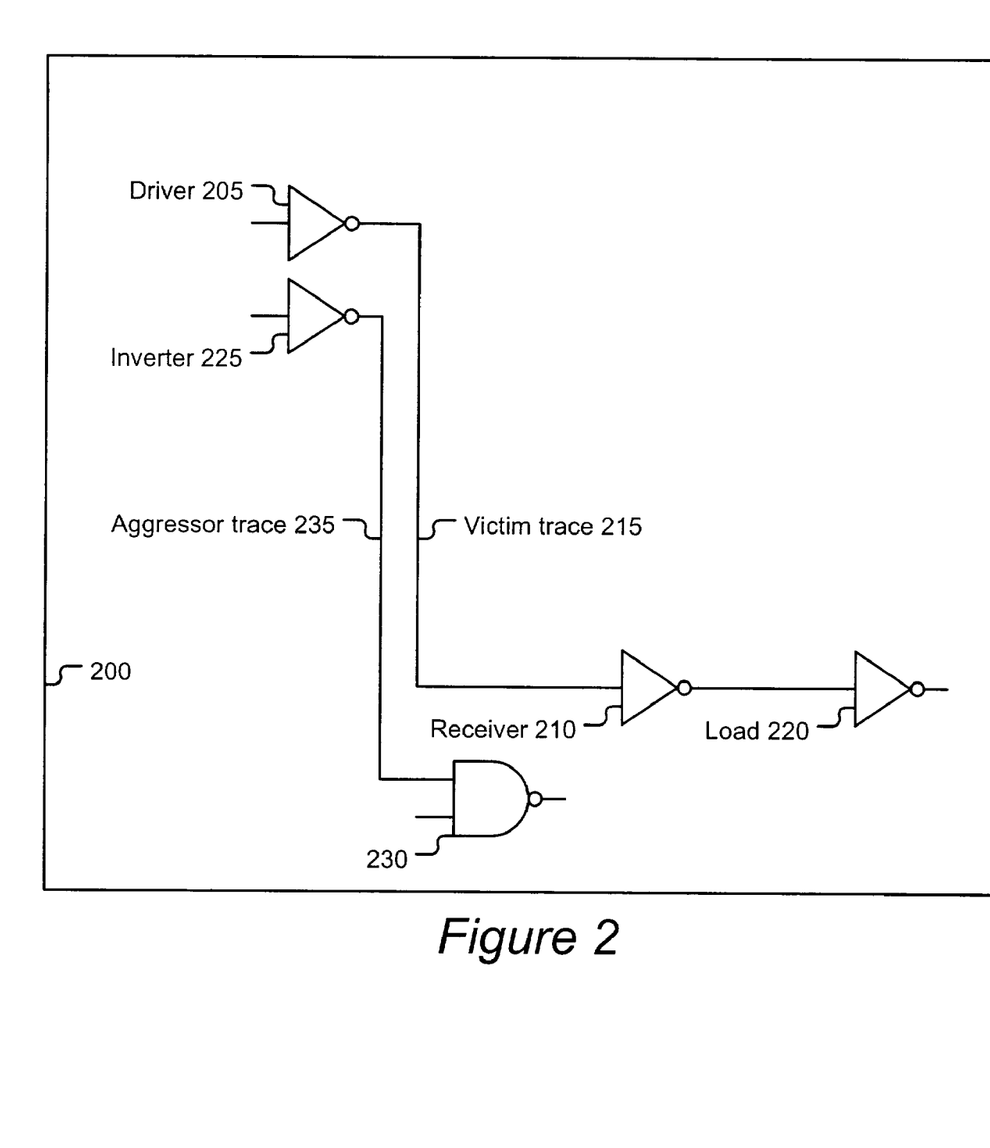
FIG. 2 presents a diagram of a portion of an electrical circuit.

FIG. 2 presents a diagram of a portion of an electrical circuit 200. This electrical circuit contains a number of integrated circuits. As shown in FIG. 2, the output port of driver 205, an inverter, is coupled to the input port of receiver 210, another inverter. The output port of driver 205 is coupled to the input port of receiver 210 via victim trace 215. Similarly, the output port of receiver 210 is coupled to the input port of load 220, another inverter. Electrical circuit 200 also includes inverter 225. The output port of inverter 225 is coupled to the input port of NAND gate 230 via aggressor trace 235.

The location of integrated circuit(s) that drive receiver 210 can be performed in a number of ways. For example, one could identify the input port(s) of receiver 210. Next, one could locate all integrated circuits that are electrically connected to the input port(s) via an electrical trace. For example, receiver 210 has only a single input port and driver 205 is the only integrated circuit that is electrically connected to the single input port via victim trace 215. Thus, driver 205 could be efficiently located.

5.2 Locating a Load

As shown in Block 110 of FIG. 1, after the integrated circuit that drives the receiver has been located, the integrated circuit that is driven by the receiver is located. The location of integrated circuit(s) that are driven by receiver 210 can be performed in a number of ways. For example, one could identify the output port(s) of receiver 210. Next, one could locate all integrated circuits that are electrically connected to the output port(s) via an electrical trace. For example, receiver 210 has only a single output port and load 220 is the only integrated circuit that is electrically connected to the single output port. Thus, load 220 could be efficiently located.

5.3 Selecting a Set of Noise-Tolerance Curves

Figure 3:
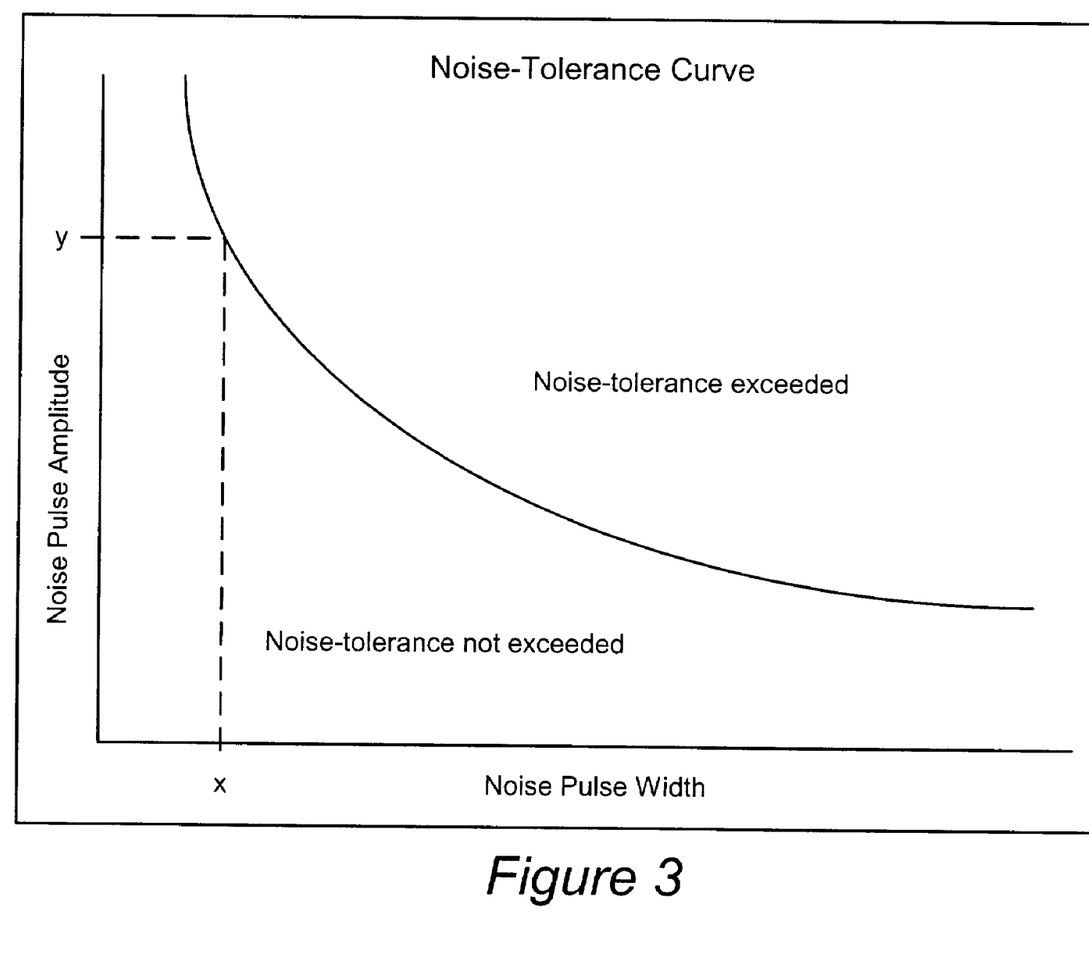
FIG. 3 presents a noise-tolerance curve.

As shown in Block 115 of FIG. 1, after the integrated circuit that is driven by the receiver has been located, a selection of a group of noise-tolerance curves can be made. An example of a noise-tolerance curve is shown in FIG. 3. The x-axis of the noise-tolerance curve is the width of a noise pulse. The y-axis of the noise-tolerance curve is the noise pulse amplitude at which an integrated circuit's output may deviate significantly from the integrated circuit's quiescent value, causing a logic state misinterpretation at this or a later receiver. Thus, referring again to FIG. 3, if a particular integrated circuit is subjected to a noise pulse having a width equal to x and an amplitude greater than y, then the integrated circuit may experience a logic state misinterpretation because the noise-tolerance of that integrated circuit would be exceeded.

In some embodiments of the invention the selection of a set of noise-tolerance curves is based upon the circuit type of the receiver. Thus, if the receiver is a static integrated circuit, then a first set of noise-tolerance curves may be selected. Similarly, if the receiver is a dynamic integrated circuit, then a second set of noise-tolerance curves could be selected. Sets of noise-tolerance curves could also be selected based on more specific integrated circuit types such as static push-pull, transmission gate, sense amp, flip-flop, AND, NAND, OR, NOR, inverter, etc. In some embodiments of the invention, the type of integrated circuit may not be known. In such cases, a set of noise-tolerance curves for unknown integrated circuit types may be selected.

5.4 Selecting a Noise-Tolerance Curve

As shown in Block 120 of FIG. 1, after the set of noise-tolerance curves has been selected, a particular noise-tolerance curve can be selected. For example, a particular noise-tolerance curve may be selected based upon one or more of a number of different circuit parameters.

One parameter that can be utilized to select a noise-tolerance curve is the capacitance of the integrated circuit that is driven by the receiver. For example, the capacitance of the input port of load 220 of FIG. 2 may be utilized to select a noise-tolerance curve. Another parameter that can be utilized to select a noise-tolerance curve is the circuit type of the integrated circuit being driven by the receiver. Examples of such circuit types include: static, dynamic, static push-pull, transmission gate, sense amp, flip-flop, AND, NAND, OR, NOR, inverter, unknown, etc. Another parameter that can be utilized to select a noise-tolerance curve is the beta-ratio of the receiver.

The beta-ratio of an integrated circuit is a measure of the capability of that integrated circuit to drive other integrated circuits into a logic "1" or a logic "0" state. The beta-ratio represents the ratio of the driving capability of two opposing portions of the integrated circuit, known as the PMOS stack and the NMOS stack. The PMOS stack drives an integrated circuit device into the logic "1" state and the NMOS stack drives the integrated circuit into the logic "0" state.

Another parameter that could be utilized to select a noise-tolerance curve includes the type of net driving the receiver, such as a clock net. In addition, the type of net driven by the receiver, such as a low voltage swing net, could be utilized to select a noise-tolerance curve.

5.5 Selecting a Set of Noise-Propagation Constants

As shown in Block 125 of FIG. 1, after selecting a noise-tolerance curve, a set of noise-propagation constants can be selected. A noise-propagation constant is a value to offset the amplitude of a noise pulse or to offset the noise-tolerance curve as described more fully below in Section 5.7. In some embodiments of the invention, a set of noise-propagation constants can be selected based upon the circuit type of the integrated circuit that drives the receiver. Such circuit types can include: static, dynamic, static push-pull, transmission gate, sense amp, flip-flop, AND, NAND, OR, NOR, inverter, unknown, etc.

5.6 Selecting a Noise-Propagation Constant

As shown in Block 130 of FIG. 1, after selecting a set of noise-propagation constants, a particular noise-propagation constant can be selected. For example, in some embodiments of the invention, the noise-propagation constant may be selected based upon the receiver circuit type.

5.7 Generating an Offset Noise-Tolerance Curve

Figure 4:
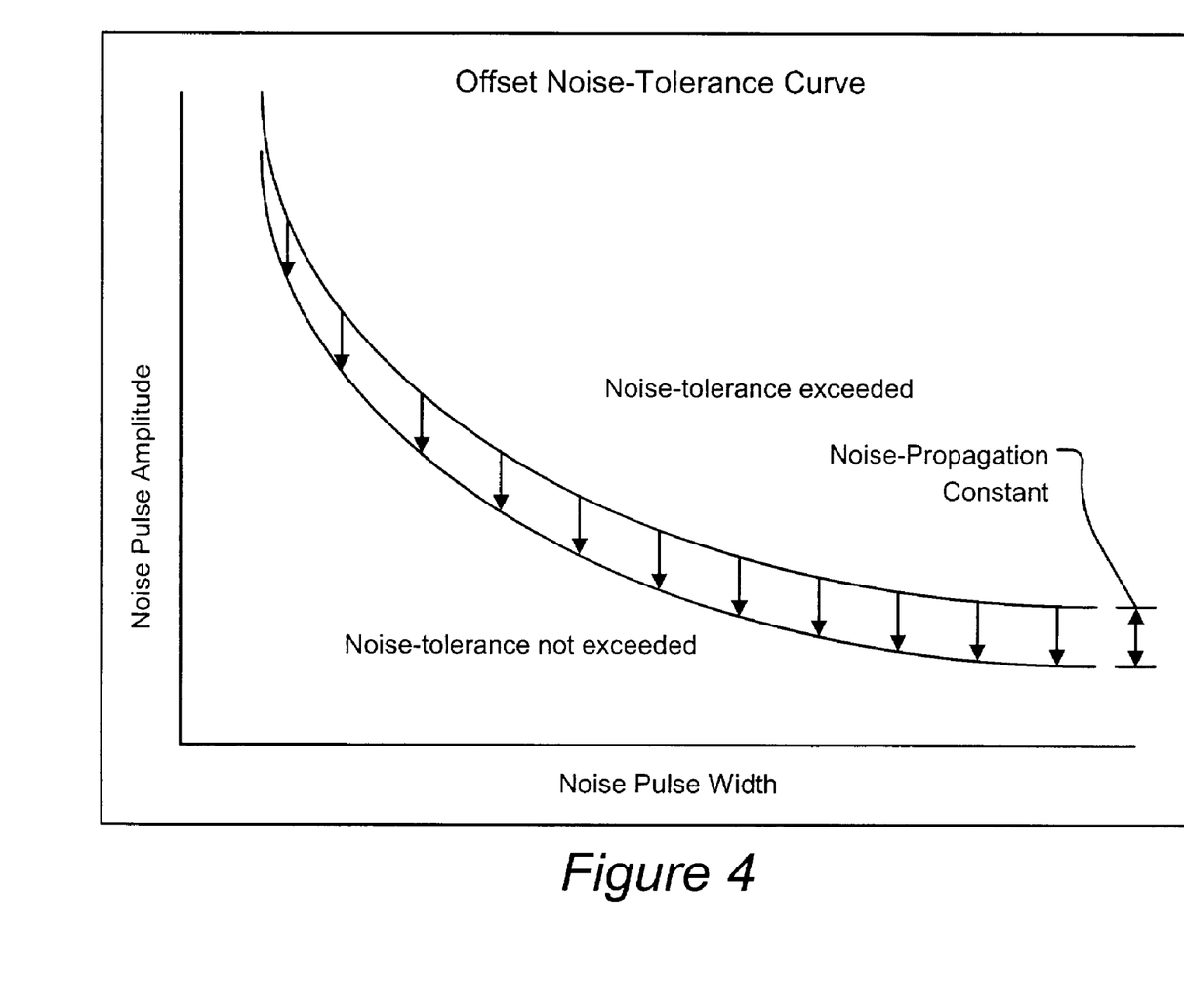
FIG. 4 presents an offset noise-tolerance curve.

As shown in Block 135 of FIG. 1, after selecting a noise-propagation constant, an offset noise-tolerance curve can be generated. As shown in FIG. 4, the noise-tolerance curve of FIG. 3 is decreased, i.e., offset in the negative y direction, by a noise-propagation constant. The resulting curve is an example of an offset noise-tolerance curve.

5.8 Determining the Noise-Tolerance of the Receiver

Figure 5:
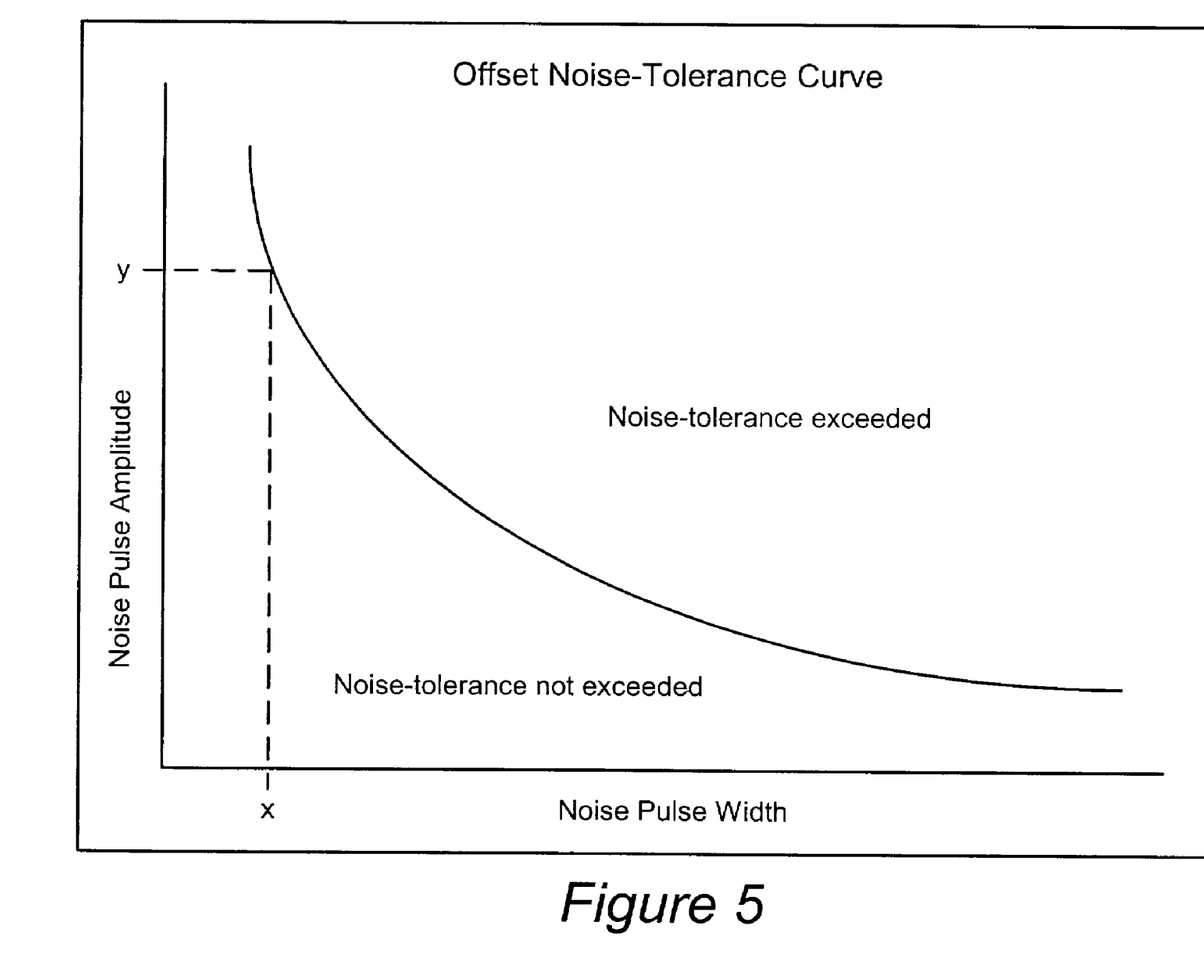
FIG. 5 presents an offset noise-tolerance curve utilized to determine the noise-tolerance of a receiver to an electrical pulse having a certain width.

As shown in Block 140 of FIG. 1, after generating an offset noise-tolerance curve, the noise tolerance of the receiver can be determined for a noise pulse. For example, as shown in FIG. 5, if the width of the noise pulse is equal to x, then the noise tolerance of the receiver is y.

5.9 Comparing the Noise-Tolerance to the Noise Pulse

As shown in Block 145 of FIG. 1, after determining the noise-tolerance of the receiver, a comparison of the noise-tolerance and the amplitude of a noise pulse can be made. If the amplitude of the noise pulse exceeds the noise-tolerance of the receiver, then the output of the receiver may significantly deviate from its quiescent value and a logic state misinterpretation may occur. On the other hand, if the amplitude of the noise pulse is less than the noise tolerance of the receiver, then the propagated noise should be negligible and a logic state misinterpretation should not occur.

5.10 Conclusion

Using the above method, a more accurate estimate of the noise-threshold of a receiver can be determined. The increased accuracy can improve the yields of electrical devices and can also allow more aggressive circuit designs.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art.

For example, one could combine numerous steps presented in the above embodiments. For example, instead of selecting a set of noise-tolerance curves and then selecting a single noise-tolerance curve from the set, one could select a noise-tolerance curve directly (without first selecting a set of noise-tolerance curves). Similarly, one could directly select a noise-propagation constant without first selecting a set of noise-propagation constants.

Other variations involve the use of the noise-propagation constant. In some embodiments of the invention, the noise-propagation constant is utilized to offset the amplitude of the noise pulse instead of offsetting the noise-tolerance curve. In still other embodiments, a noise-propagation constant is not utilized at all. In such embodiments, a (non-offset) noise-tolerance value is compared with the amplitude of a noise pulse to determine if a logic state misinterpretation is likely to occur.

Still other variations include program storage devices containing instructions that when executed by a computer, perform portions of the above-described methods. Other variations include electrical devices that are manufactured using portions of the above-described methods.

Additionally, the above disclosure is not intended to limit the present invention. The scope of the present invention is defined by the appended claims.

What is claimed is:

1. A method of predicting whether a failure of an electrical device may occur if a receiver within the electrical device is subjected to a noise pulse, the receiver having a circuit type and a beta-ratio, the noise pulse having an amplitude and a width, the method comprising:
   a) locating an integrated circuit that drives the receiver, the integrated circuit that drives the receiver having a circuit type;
   b) locating an integrated circuit that is driven by the receiver, the integrated circuit that is driven by the receiver having a circuit type and a capacitance;
   c) selecting, based at least in part upon the circuit type of the receiver, a plurality of noise-tolerance curves;
   d) selecting, based at least in part upon the capacitance of the integrated circuit that is driven by the receiver, the circuit type of the integrated circuit driven by the receiver, and the beta-ratio of the receiver, one of the plurality of noise-tolerance curves;
   e) selecting a set of noise-propagation constants based at least in part upon the circuit type of the integrated circuit that drives the receiver;
   f) selecting a noise-propagation constant from the set of noise-propagation constants based at least in part upon the receiver circuit type;
   g) generating an offset noise-tolerance curve by offsetting the selected one of the plurality of noise-tolerance curves by the noise-propagation constant;
   h) detennining, based at least in part upon the offset noise-tolerance curve and the width of the noise pulse, a noise-tolerance; and
   i) comparing the noise-tolerance to the amplitude of the noise pulse.

2. The method of claim 1, wherein locating the integrated circuit that drives the receiver includes identifying an input port of the receiver.

3. The method of claim 1, wherein locating the integrated circuit that drives the receiver includes locating all integrated circuits that are electrically connected to the input port via an electrical trace.

4. The method of claim 1, wherein locating the integrated circuit that drives the receiver includes identifying an input port of the receiver and includes locating all integrated circuits that are electrically connected to the input port via an electrical trace.

5. The method of claim 1, wherein selecting a plurality of noise-tolerance curves includes selecting the plurality of noise-tolerance curves based upon whether the receiver has a circuit type that is selected from a set of circuit types including: static and dynamic.

6. The method of claim 1, wherein selecting a plurality of noise-tolerance curves includes selecting the plurality of noise-tolerance curves based upon whether the receiver has a circuit type that is selected from a set of circuit types including: static, dynamic, static push-pull, transmission gate, sense amp, and flip-flop.

7. The method of claim 1, wherein selecting a plurality of noise-tolerance curves includes selecting the plurality of noise-tolerance curves based upon whether the receiver has a circuit type that is selected from a set of circuit types including: static, dynamic, static push-pull, transmission gate, sense amp, flip-flop, and unknown.

8. A method of predicting whether a failure of an electrical device may occur if a receiver within the electrical device is subjected to a noise pulse, the receiver having a circuit type and a beta-ratio, the noise pulse having an amplitude and a width, the method comprising:
  a) locating an integrated circuit that drives the receiver, the integrated circuit that drives the receiver having a circuit type;
  b) locating an integrated circuit that is driven by the receiver, the integrated circuit that is driven by the receiver having a circuit type and a capacitance;
  c) selecting, based at least in part upon the circuit type of the receiver, a plurality of noise-tolerance curves;
  d) selecting, based at least in part upon the capacitance of the integrated circuit that is driven by the receiver, the circuit type of the integrated circuit driven by the receiver, and the beta-ratio of the receiver, one of the plurality of noise-tolerance curves;
  e) selecting a noise-propagation constant based at least in part upon the circuit type of the integrated circuit that drives the receiver;
  f) determining, based upon the noise-tolerance curve and the width of the noise pulse, a noise-tolerance; and
  g) comparing the noise-tolerance to the amplitude of the noise pulse.

9. The method of claim 8, wherein locating the integrated circuit that drives the receiver includes identifying an input port of the receiver.

10. The method of claim 8, wherein locating the integrated circuit that drives the receiver includes locating all integrated circuits that are electrically connected to the input port via an electrical trace.

11. The method of claim 8, wherein locating the integrated circuit that drives the receiver includes identifying an input port of the receiver and includes locating all integrated circuits that are electrically connected to the input port via an electrical trace.

12. The method of claim 8, wherein selecting a plurality of noise-tolerance curves includes selecting the plurality of noise-tolerance curves based upon whether the receiver has a circuit type that is selected from a set of circuit types including: static and dynamic.

13. The method of claim 8, wherein selecting a plurality of noise-tolerance curves includes selecting the plurality of noise-tolerance curves based upon whether the receiver has a circuit type that is selected from a set of circuit types including: static, dynamic, static push-pull, transmission gate, sense amp, and flip-flop.

14. The method of claim 8, wherein selecting a plurality of noise-tolerance curves includes selecting the plurality of noise-tolerance curves based upon whether the receiver has a circuit type that is selected from a set of circuit types including: static, dynamic, static push-pull, transmission gate, sense amp, flip-flop, and unknown.

15. A method of predicting whether a failure of an electrical device may occur if a receiver within the electrical device is subjected to a noise pulse, the receiver having a beta-ratio, the noise pulse having an amplitude and a width, the method comprising:
  a) locating an integrated circuit that drives the receiver;
  b) locating an integrated circuit that is driven by the receiver;
  c) selecting, based at least in part upon the beta-ratio of the receiver, a noise-tolerance curve;
  d) determining, based at least in part upon the noise-tolerance curve and the width of the noise pulse, a noise-tolerance; and
  e) comparing the noise-tolerance to the amplitude of the noise pulse.

16. The method of claim 15, wherein locating the integrated circuit that drives the receiver includes identifying an input port of the receiver.

17. The method of claim 15, wherein locating the integrated circuit that drives the receiver includes locating all integrated circuits that are electrically connected to the input port via an electrical trace.

18. The method of claim 15, wherein locating the integrated circuit that drives the receiver includes identifying an input port of the receiver and includes locating all integrated circuits that are electrically connected to the input port via an electrical trace.

19. A program storage device containing computer readable instructions, that when executed by a computer perform a method of predicting whether a failure of an electrical device may occur if a receiver within the electrical device is subjected to a noise pulse, the receiver having a circuit type and a beta-ratio, the noise pulse having an amplitude and a width, the method comprising:
  a) locating an integrated circuit that drives the receiver, the integrated circuit that drives the receiver having a circuit type;
  b) locating an integrated circuit that is driven by the receiver, the integrated circuit that is driven by the receiver having a circuit type and a capacitance;
  c) selecting, based at least in part upon the circuit type of the receiver, a plurality of noise-tolerance curves;
  d) selecting, based at least in part upon the capacitance of the integrated circuit that is driven by the receiver, the circuit type of the integrated circuit driven by the receiver, and the beta-ratio of the receiver, one of the plurality of noise-tolerance curves;
  e) selecting a noise-propagation constant based at least in part upon the circuit type of the integrated circuit that drives the receiver;
  f) determining, based upon the noise-tolerance curve and the width of the noise pulse, a noise-tolerance; and
  g) comparing the noise-tolerance to the amplitude of the noise pulse.

20. A method of fabricating an electrical device that contains a receiver, the receiver having a circuit type and a beta-ratio, the noise pulse having an amplitude and a width, the method comprising:
  a) locating an integrated circuit that drives the receiver, the integrated circuit that drives the receiver having a circuit type;
  b) locating an integrated circuit that is driven by the receiver, the integrated circuit that is driven by the receiver having a circuit type and a capacitance;
  c) selecting, based at least in part upon the circuit type of the receiver, a plurality of noise-tolerance curves;
  d) selecting, based at least in part upon the capacitance of the integrated circuit that is driven by the receiver, the circuit type of the integrated circuit driven by the receiver, and the beta-ratio of the receiver, one of the plurality of noise-tolerance curves;
  e) selecting a noise-propagation constant based at least in part upon the circuit type of the integrated circuit that drives the receiver;
  f) determining, based upon the noise-tolerance curve and the width of the noise pulse, a noise-tolerance;
  g) comparing the noise-tolerance to the amplitude of the noise pulse; and
  h) fabricating the electrical device.

21. An electrical device designed by a process that includes a method of predicting whether a failure of an electrical device may occur if a receiver within the electrical device is subjected to a noise pulse, the receiver having a circuit type and a beta-ratio, the noise pulse having an amplitude and a width, the method comprising:
 a) locating an integrated circuit that drives the receiver, the integrated circuit that drives the receiver having a circuit type;
 b) locating an integrated circuit that is driven by the receiver, the integrated circuit that is driven by the receiver having a circuit type and a capacitance;
 c) selecting, based at least in part upon the circuit type of the receiver, a plurality of noise-tolerance curves;
 d) selecting, based at least in part upon the capacitance of the integrated circuit that is driven by the receiver, the circuit type of the integrated circuit driven by the receiver, and the beta-ratio of the receiver, one of the plurality of noise-tolerance curves;
 e) selecting a noise-propagation constant based at least in part upon the circuit type of the integrated circuit that drives the receiver;
 f) determining, based upon the noise-tolerance curve and the width of the noise pulse, a noise-tolerance;
 g) comparing the noise-tolerance to the amplitude of the noise pulse; and
 h) fabricating the electrical device.

* * * * *